United States Patent
Graf et al.

(10) Patent No.: US 10,036,766 B2
(45) Date of Patent: Jul. 31, 2018

(54) METHOD FOR PRODUCING A FORCE-MEASURING ELEMENT

(71) Applicant: Sartorius Lab Instruments GmbH & Co. KG, Goettingen (DE)

(72) Inventors: Winfried Graf, Niemetal (DE); Friedrich Helmsen, Goettingen (DE); Detlev Erben, Goettingen (DE); Helga Covic, Goettingen (DE); Tanja Mueck, Langelsheim (DE)

(73) Assignee: Sartorius Lab Instruments GmbH & CO. KG, Goettingen (DE)

( * ) Notice: Subject to any disclaimer, the term of this patent is extended or adjusted under 35 U.S.C. 154(b) by 406 days.

(21) Appl. No.: 15/010,157

(22) Filed: Jan. 29, 2016

(65) Prior Publication Data

US 2016/0223591 A1 Aug. 4, 2016

Related U.S. Application Data

(63) Continuation of application No. PCT/EP2014/001508, filed on Jun. 4, 2014.

(30) Foreign Application Priority Data

Jul. 29, 2013 (DE) .......... 10 2013 108 097

(51) Int. Cl.
*G01L 1/00* (2006.01)
*G01R 3/00* (2006.01)
(Continued)

(52) U.S. Cl.
CPC .............. *G01R 3/00* (2013.01); *G01G 3/1414* (2013.01); *G01L 1/04* (2013.01); *G01L 1/2243* (2013.01); *G01L 25/00* (2013.01)

(58) Field of Classification Search
CPC .......... G01R 3/00; G01G 3/1414; G01L 1/04; G01L 1/2243; G01L 25/00
(Continued)

(56) References Cited

U.S. PATENT DOCUMENTS 3,968,683 A 7/1976 Ormond
4,112,746 A * 9/1978 Itoh .................... G01N 3/068
73/789
(Continued)

FOREIGN PATENT DOCUMENTS

DE 10139443 A1 3/2003
DE 10229016 A1 2/2004
(Continued)

OTHER PUBLICATIONS

International Search Report in counterpart International Application No. PCT/EP2014/001508, dated Oct. 8, 2014.

*Primary Examiner* — Max Noori
(74) *Attorney, Agent, or Firm* — Edell, Shapiro & Finnan, LLC

(57) ABSTRACT

A method for producing a force-measuring element (10) having at least one articulation point (20) which separates one region of the force-measuring element (10) into two connected subregions (11, 12) which can be deflected in relation to one another. The method includes: providing a force-measuring element blank (10), removing material from the force-measuring element blank (10) in order to produce the articulation point (20), checking whether the deflection behavior of the subregions (11, 12) which is produced by the articulation point corresponds to a predefined specification, defining a correction form (30) which can be produced through material removal and compensates for an ascertained deviation from the predefined specification, correcting the articulation point geometry using a laser and the previously defined correction form (30), through material removal at the articulation point.

2 Claims, 4 Drawing Sheets

(51) Int. Cl.
    *G01L 1/22* (2006.01)
    *G01G 3/14* (2006.01)
    *G01L 1/04* (2006.01)
    *G01L 25/00* (2006.01)
(58) Field of Classification Search
    USPC .................................................. 73/862.541
    See application file for complete search history.

(56) References Cited

U.S. PATENT DOCUMENTS

| | | | | |
|---|---|---|---|---|
| 5,670,753 | A * | 9/1997 | Krause | G01G 3/14 177/211 |
| 7,150,200 | B1 * | 12/2006 | Cavallaro | G01N 3/02 73/826 |
| 2003/0154037 | A1 * | 8/2003 | Demia | G01L 1/2218 702/42 |
| 2008/0236300 | A1 * | 10/2008 | Mueck | G01B 7/20 73/862.627 |
| 2010/0044119 | A1 | 2/2010 | Burkhard et al. | |

FOREIGN PATENT DOCUMENTS

| | | |
|---|---|---|
| EP | 0164862 A2 | 12/1985 |
| WO | 2008145426 A1 | 12/2008 |

\* cited by examiner

METHOD FOR PRODUCING A FORCE-MEASURING ELEMENT

CROSS REFERENCE TO RELATED APPLICATIONS

This is a Continuation of International Application PCT/EP2014/001508, which has an international filing date of Jun. 4, 2014, and the disclosure of which is incorporated in its entirety into the present Continuation by reference. The following disclosure is also based on and claims the benefit of and priority under 35 U.S.C. § 119(a) to German Patent Application No. DE 10 2013 108 097.9, filed Jul. 29, 2013, which is also incorporated in its entirety into the present Continuation by reference.

FIELD OF THE INVENTION

The invention relates to a method for producing a force-measuring element having at least one articulation site which separates a region of the force-measuring element into two connected sub-regions which deflect relative to one another.

BACKGROUND

A method for producing a force-measuring element having at least one articulation site which separates a region of the force-measuring element into two connected sub-regions which deflect relative to one another is known. In a first step, material is removed from a force-measuring element blank so that it is separated into two sub-regions which can be deflected relative to one another. In a next method step, it is tested whether the deflection behavior of the sub-regions created by the articulation site corresponds to a predefined specification. The expression "deflection behavior" should be understood broadly herein and particularly covers the aspects of the mobility of the articulation site, the articulation direction of the sub-regions that are articulated to one another and the exact position of the rotation point. A deviation measured for this purpose is correspondingly corrected in a next method step in that material is removed at the articulation site with a cutting tool, for example, with a file. This material removal can be carried out by machine but is preferably carried out by hand, by a trained specialist.

A disadvantage of this method is that, typically, an articulation site correction of this type does not entirely remedy the measured deviation. Additionally, due to the material removal by cutting, a force is exerted on the articulation site which in turn can cause an undesired plastic deformation of the bending body produced due to the articulation site, or tensions in the material of the articulation site.

From WO 2008/145426 A1, a force measuring element is known wherein the articulation site correction takes place through plastic deformation of a deformation site of the force-measuring element. In this force-measuring element, therefore, during the articulation site correction, material removal at the articulation site itself is entirely dispensed with.

It is also known that force-measuring elements can be produced through material removal by a laser from a suitable force-measuring element blank. For example, from DE 102 29 016 A1, a pivot bearing for weighing bridges which is machined by laser cutting from a monolithic basic body is known. A correction of the articulation sites of the pivot bearing is, however, no longer carried out following production.

Further force-measuring elements are known from U.S. Pat. No. 3,968,683 A and EP 0 164 862 A2. The load-dependent deformation of these force-measuring elements is detected with strain gauges which can be adjusted through material removal by a laser. However, a correction of the articulation site geometry is not provided with these force-measuring elements either.

A method for producing a force-measuring element wherein a correction of the articulation site geometry takes place through material removal by a laser is known from DE 101 39 443 A1. In this method, the force-measuring element is induced to oscillate during the material removal and the oscillation change arising from the material removal is detected as a parameter, for example, for setting the sensitivity of the force-measuring element. For this purpose, the oscillation change is measured instantaneously and the material removal is continued until the measured oscillation corresponds to a pre-determined specification.

A disadvantage of this method is that only during the material removal is it determined whether the desired specification can be achieved at all. As a consequence of this, the known method operates less efficiently since material removal is also carried out at force-measuring elements for which the desired specification can no longer be realized by material removal of this type. In addition, a force-measuring element of this type becomes completely unusable due to this material removal and must therefore necessarily be classified as a defective product. This is disadvantageous particularly with regard to the costs associated with the production of the force-measuring element.

SUMMARY

It is an object of the present invention to minimize defective products during the production of force-measuring elements.

This object is addressed with the inventive method by executing the following steps:
a) providing a force-measuring element blank,
b) removing material from the force-measuring element blank to produce the articulation site having an actual articulation site geometry,
c) testing whether a deflection behavior of the sub-regions which is created by the articulation site corresponds to a predetermined accuracy class or deviates therefrom, wherein
   c1) if the deflection behavior corresponds to the predetermined specification, ending the method, and
   c2) if the deflection behavior deviates from the predetermined specification, executing step d,
d) testing whether the deviation is compensatable with an articulation site correction, wherein
   d1) if the deviation is compensatable, executing steps e through g and
   d2) if the deviation is not compensatable, executing step h,
e) determining a correction form producible through material removal, which compensates for the deviation from the predetermined specification,
f) correcting the articulation site geometry in accordance with the determined correction form through material removal with a laser,
g) again executing the step c,
h) testing whether the deflection behavior corresponds to a lower accuracy class specification or deviates therefrom, wherein h1) if the deflection behavior corresponds to the lower specification, classifying the force-measuring element in the lower accuracy class and ending the method, and h2) if the deflection behavior deviates from the lower specification, classifying the force-measuring element as a defective product and ending the method.

The inventive production method, in contrast to the already known methods, provides that before the actual correction of the articulation site geometry, it is first tested whether a detected deviation of the deflection behavior of the force-measuring element from a predetermined specification can be compensated for at all. Only in the event that such a compensation is possible, is the articulation site correction carried out through material removal using a laser. Because only correctable force-measuring elements are actually corrected, force-measuring elements for which an existing deviation can no longer be compensated consequently remain unprocessed. Those force measuring elements that could still qualify for a lower accuracy class need only be classified as defective products in the event that their deflection behavior ultimately fails to correspond to the specificity of even this lower accuracy class. Due to the testing carried out before the articulation site correction and the possibility of classifying the force-measuring element in a lower accuracy class, the level of defective production in the inventive production method, and thus the manufacturing costs for the force-measuring element, are consequently significantly reduced.

The correction of the articulation site geometry is necessary whenever the deflection behavior of the sub-regions which is created by the articulation site does not correspond to a predetermined specification. This is the case, for example, if the deflection direction of the sub-regions of the force-measuring element which are deflectable relative to one another and which arise through the articulation site does not lie perpendicular to a bending plane of the articulation site or if this subregion experiences a twist during the deflection due to the application of an eternal force. Such errors can arise if the material removal during the production of an articulation site is not even, so that the articulation site has excess material or an elevation at one site.

A very precise material removal on the order of a few micrometers is possible with the inventive method. Thus an error due to off-center loading can be reduced by approximately 85% per correction step using laser correction, whereas a correction using material removal through cutting generally produces an effect per correction step of only 50% at most. This reduces the number of correction steps required or leads to a better result with the same number of correction steps.

Using a laser, a very small amount of material can be removed in a targeted way or particularly small shapes in the micrometer range can be machined out of the material, which is not realizable with non-laser-based methods. Thus, using the method according to the invention, a force-measuring element can be produced to have a high level of insensitivity to off-center loading.

Furthermore, hard surface layers arising when milling or drilling, the usual techniques for first machining of the force-measuring element blank, which disadvantageously alter the flexibility of the articulation site, can be removed. At the same time, no further disadvantageous changes to the structure of the material that is not removed take place during material removal when a laser is used, since a laser can be directed in so targeted a way onto the material region to be removed that the surrounding material does not experience any changes due to a raised temperature. Also, during the articulation site geometry correction using a laser, no material splinters are produced which could contaminate, in a function-impairing manner, the force-measuring apparatus. This is particularly important in the rather routine situations in which the force-measuring apparatus is already at this point in time equipped with several assembly components, such as an electromagnetic coil arrangement for force compensation, which would require careful removal of the splinters.

Furthermore, in general, the present invention enables milling deviations and backlash errors in articulation sites to be compensated for. A further advantage of laser articulation site correction is that the material removal takes place force-free. In other words, no additional force is applied to the articulation site that would plastically deform it. Furthermore, with a laser, no wearing of the tool takes place, and this is beneficial for the reproducibility during the production of correction forms.

The correction form used in the inventive method is essentially arbitrary and can be adapted in each instance to the requirements of the individual case. Thus, for example, point-form depressions or trenches with vertical sink edges are possible. Finally, through the improved quality of the correction of the articulation site geometry of a force-measuring element using a laser, the defective production of such force-measuring elements can he significantly reduced, leading, in turn, to reductions in production effort and costs. In the case of automated processing, the inventive method is also less time-intensive.

The corrected articulation site can have, for example, a region of parallel surfaces. In other words, the surface of one side of the articulation site lies in a plane that is parallel to the plane of the surface of the opposite side of the articulation site. With the articulation site having this type of form, the two sub-regions of the force-measuring element which arise can be very easily deflected relative to one another with an already small external force application as compared with an articulation site of the same order of size without a parallel region. Providing the articulation site with such a high degree of sensitivity has the result that an external force application can be determined with high precision using a suitably configured force-measuring apparatus.

The corrected articulation site can also have, for example, at least one slit which subdivides the articulation site into at least two web-like articulation site regions. With a multiple articulation site of this type, the elasticity of the articulation site can be increased with slits in comparison with an articulation site of the same design but without a slit.

Furthermore, all conceivable forms of an articulation site are possible due to the high shape accuracy of the material removal through a laser. This is especially advantageous in particular because the shape of the articulation site can be selected in accordance with the requirements placed on the sub-regions and the flexibility between the sub-regions.

The correction form can be represented, for example, by a closed mathematical expression. This has the advantage that the quantity of material to be removed can be easily determined and therefore the correction of the articulation site geometry is simplified by the targeted material removal. Furthermore, a form which can be represented by a closed mathematical expression is more easily reproducible and producible with machines than is an arbitrary form.

One of the deflectable subregions of the force-measuring element can be fashioned as, for example, a lever arm. With a lever arm of this type, the external force application to a sensor can be measured with force amplification or deflection amplification. It is therefore particularly important that the deflection direction of the lever arm is not influenced by a faulty articulation site. This would result in falsification of the measurement value for the external force application. The shape accuracy of such articulation sites that can be achieved with a laser is thus particularly important.

Further features and advantages of the invention are disclosed in the following description and the drawings.

BRIEF DESCRIPTION OF THE DRAWINGS

FIG. 1A shows an embodiment without any external force application, FIG. 1B shows an embodiment of the force-measuring element with external force application and a deflection direction parallel to the bending plane, and FIG. 1C shows an embodiment of a force-measuring element with external force application and a deflection direction of a sub-region not parallel to the bending plane, FIGS. 2A-2D: show two sub-regions separated by an articulation site, wherein the articulation site in:

FIG. 2A has an articulation site correction with a double trench and a parallel region, FIG. 2B has a flat depression, FIG. 2C has an evenly rounded depression which has an oval form, and FIG. 2D has a circular articulation site correction, FIGS. 3A-3E: show embodiments in which FIG. 3A shows a biconcave articulation site, FIG. 3B shows a multiple articulation site which is configured as a double articulation site, FIG. 3C shows a biconvex articulation site, FIG. 3D shows an articulation site with a parallel region, and FIG. 3E shows an articulation site with two rounded grooves.

DETAILED DESCRIPTION

Figure 1A:
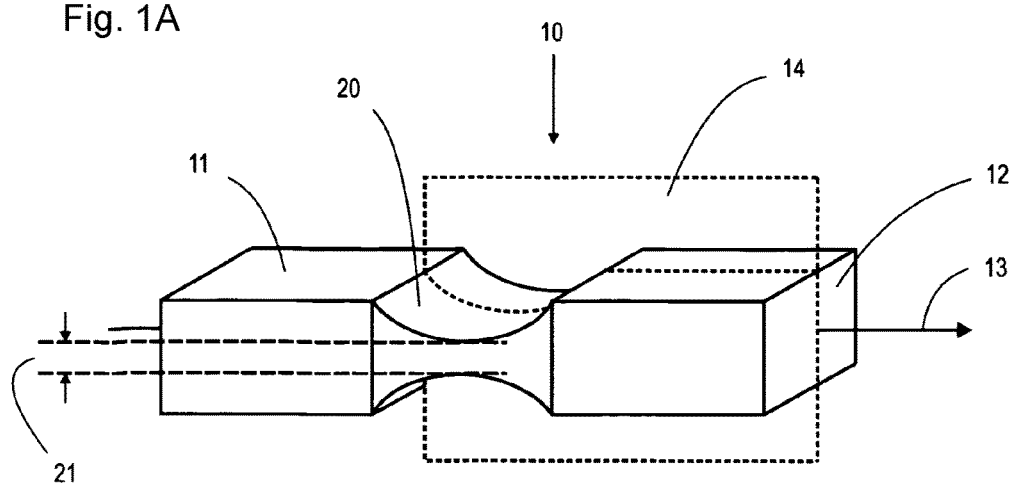
FIGS. 1A-1C: show a force-measuring element which comprises two subregions separated by an articulation site. Herein.
Figure 1B:
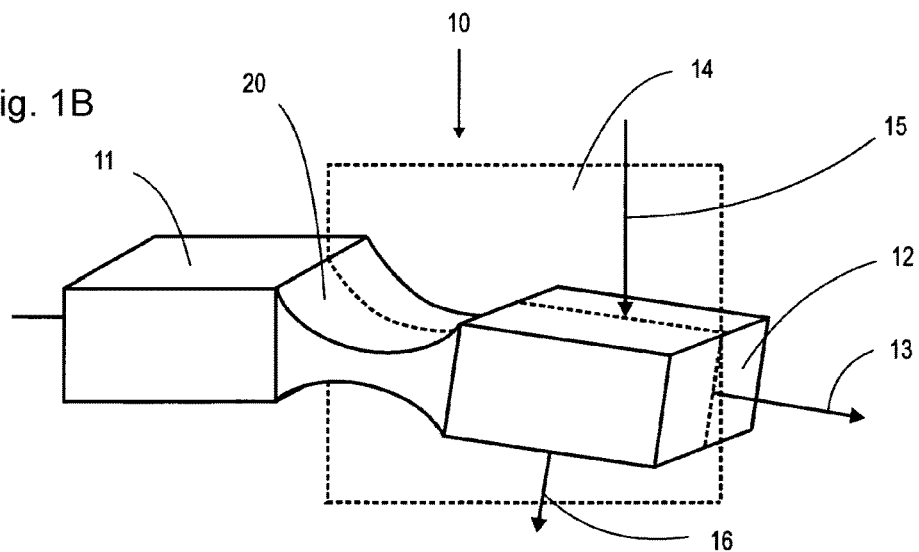
Figure 1C:
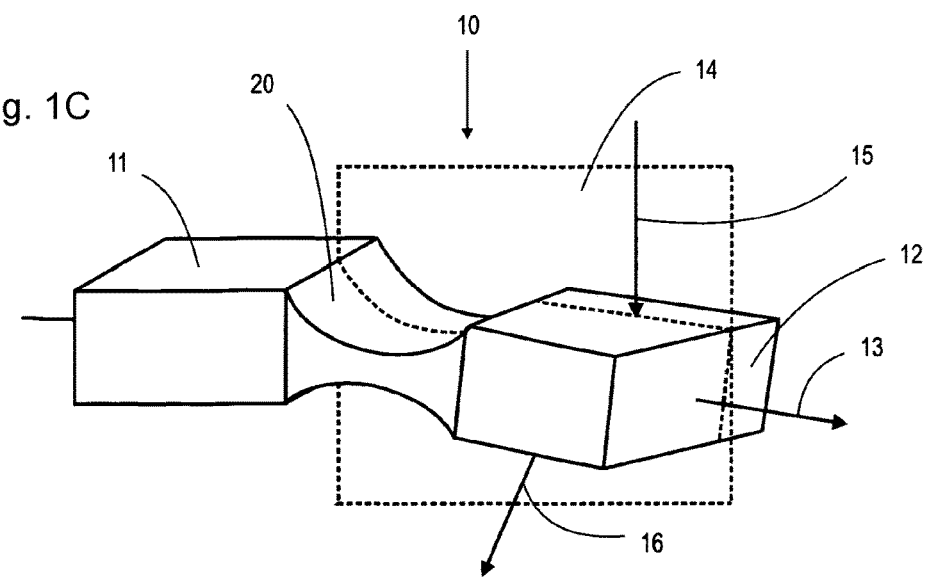

FIGS. 1A-1C show a force-measuring element 10 which is separated by an articulation site 20 into two sub-regions 11, 12. In FIG. 1A, without an external force application 15 (lacking in FIG. 1A the body axis 13 lies in the bending plane 14 of the articulation site 20. FIG. 1B shows an embodiment of the force-measuring element 10, wherein an external force application 15 acts on a sub-region 12. The geometry of the articulation site 20 is configured so that if a direction of the external force application 15 lies in the bending plane 14, the deflection direction 16 of the sub-region 12 is also in the bending plane 14. An articulation site geometry of this type is calculated to be error-free and needs no correction, provided the thickness and the position of the articulation site and therefore its mobility complies with the specifications. FIG. 1C shows an embodiment of a force-measuring element 10 with an articulation site geometry needing to be corrected. The sub-region 12 deflected by the external force application 15 has a deflection direction 16 which is not parallel to the bending plane 14. Furthermore, its body axis 13 does not lie in the bending plane 14. An articulation site geometry of this type must therefore be corrected so that the deflection direction 16 of the sub-region 12 lies in the bending plane 14 during an external force application 15. A deflection behavior of this type is generally undesirable, although it can be corrected through material removal of a suitable form and size, for example, through material removal using laser processing.

Figures 2A, 2B, 2C, 2D:
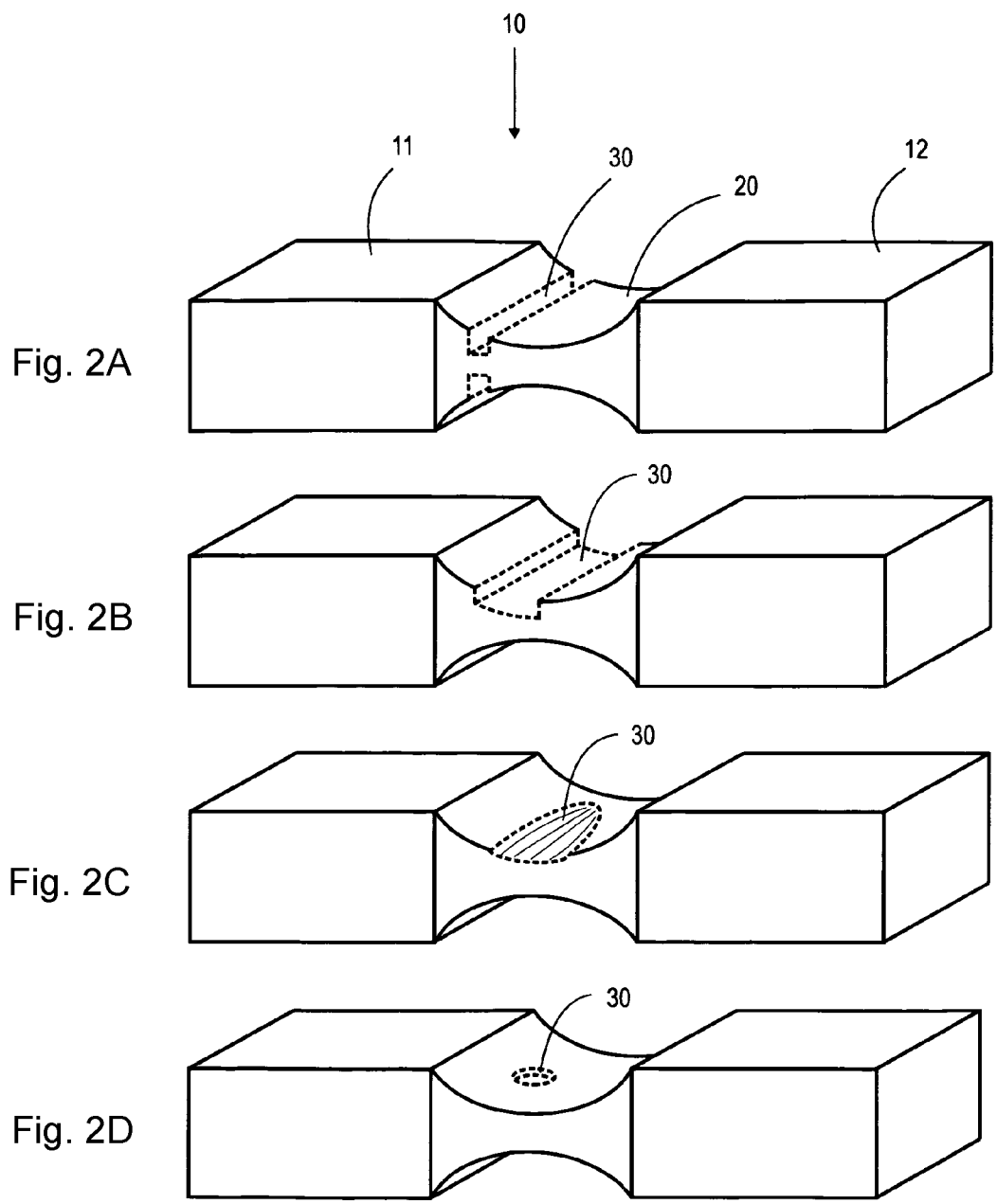

FIGS. 2A-2D show a force-measuring element 10 with an articulation site 20 which separates two sub-regions 11, 12 of the force-measuring element 10 from one another. The biconcave articulation site geometry configured here has been corrected using a laser and on the basis of a previously determined correction form 30. Herein, FIG. 2A shows a correction form which has a double trench with regions that are parallel to one another, FIG. 2B shows a correction form 30 with depressions perpendicular to the articulation site surface and an evenly flat depression plane, FIG. 2C shows a depression which is curved in its depth and has a half-oval form on its surface, and FIG. 2D shows a point-shaped or circular correction form which can penetrate the articulation site 20 partially or entirely. Such correction forms 30 of the articulation site geometry change the deflection behavior of the two sub-region 11, 12 of the force-measuring element 10 differently. Thus, first, the mobility can be increased, although alternatively or additionally, the deflection direction 16 of the subregion 12 and/or the exact position of the rotation point can be changed. Thus a twist or a vertical inclination sensitivity of the sub-region 12 can be corrected and a deflection direction 16 caused by an external force application 15 which is parallel to the bending plane 14 can be achieved.

Figure 3A:
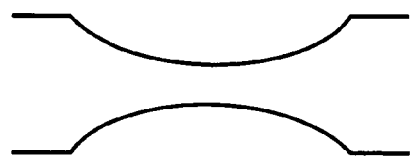
Figure 3B:
Figure 3C:
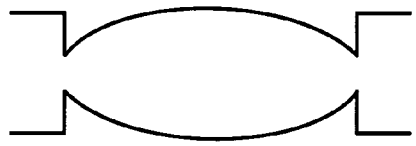
Figure 3D:
Figure 3E:

FIGS. 3A-3E show different embodiments of an articulation site which has been created or corrected using a laser. Thus, FIG. 3A shows a biconcave articulation site, FIG. 3B shows a multiple articulation site which is configured as a double articulation site, FIG. 3C shows a biconvex articulation site, FIG. 3D shows an articulation site with a parallel region and FIG. 3E shows an articulation site with two rounded grooves.

Figure 4:
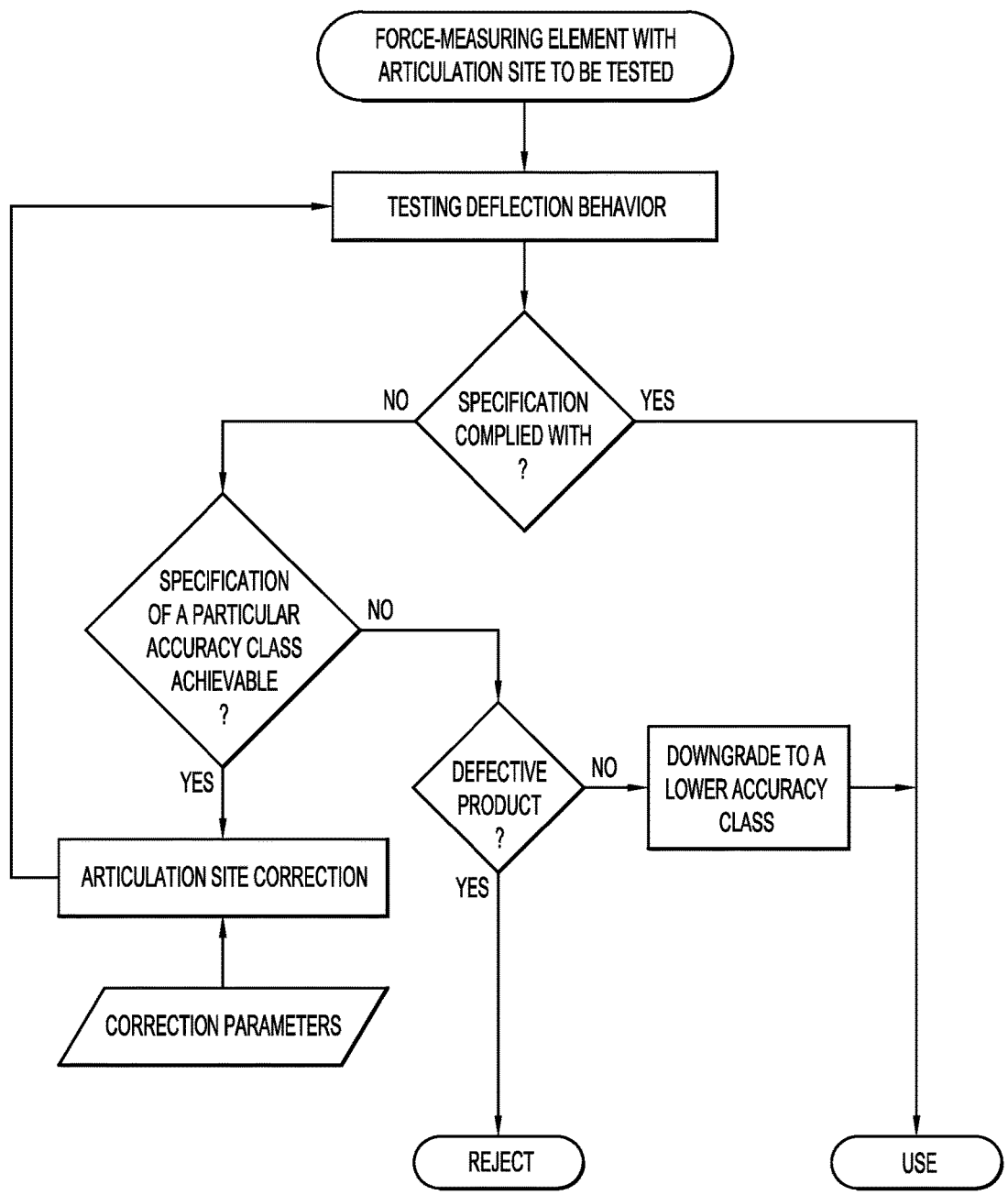
FIG. 4: shows a schematic representation of the method sequence according to the invention for producing a force-measuring element.

FIG. 4 shows a schematic representation of the method sequence according to the invention for producing a force-measuring element 10, said method comprising a correction of the articulation site geometry. In a first method step, not shown here, an articulation site 20 is created on a force-measuring element 10 through cutting material removal, so that the articulation site 20 separates two sub-regions 11, 12 of the force-measuring element 10 from one another. In a second method step, the force-measuring element 10 with an articulation site 20 is subjected to testing of the deflection behavior. The measurement values determined are compared with a predefined specification and it is tested whether this specification has been complied with or not. In the first case, the force-measuring element 10 is correctly configured and can be used directly. In the latter case, it is tested in a next method step whether an articulation site correction can compensate for the measured error in the force-measuring element 10. If the specification for a particular accuracy class of the force-measuring element 10 is achievable with an articulation site correction, then an articulation site correction of this type is carried out in a next method step. Herein, the previously determined deviations of the deflection behavior of the force-measuring element 10 from the data specification are converted into correction parameters so that a suitable correction form can be determined and used at the articulation site 20.

If however, the result of the estimation of prospects for the success of a correction is that it cannot sufficiently reduce or remedy the errors, then in a next method step, it is tested whether the force-measuring element 10 can be assigned to a lower accuracy class or whether the errors are so serious that it is to be assigned as a defective product to rejected goods. On the basis of a correction method of this type, therefore, defective item production and therefore the manufacturing costs of force-measuring elements are reduced.

The embodiments covered by the specific description above and shown in the figures are merely illustrative exemplary embodiments of the present invention. A broad spectrum of possible variations will be evident to a person skilled in the art, based on the present disclosure.

REFERENCE SIGNS

10 Force-measuring element
11 First sub-region of the force-measuring element
12 Second sub-region of the force-measuring element
13 Body axis
14 Bending plane
15 Direction of external force application
16 Deflection direction
20 Articulation site
21 Thickness of the articulation site
30 Correction form

What is claimed is:

1. A method for producing a force-measuring element having at least one articulation site which separates a region of the force-measuring element into two connected sub-regions which deflect relative to one another, comprising:
   a) providing a force-measuring element blank,
   b) removing material from the force-measuring element blank to produce the articulation site having an actual articulation site geometry,
   c) testing whether a deflection behavior of the sub-regions through the articulation site corresponds to a predetermined accuracy class specification or deviates therefrom, wherein
      c1) if the deflection behavior corresponds to the predetermined specification, ending the method, and
      c2) if the deflection behavior deviates from the predetermined specification, executing step d,
   d) testing whether the deviation is compensatable with an articulation site correction, wherein
      d1) if the deviation is compensatable, executing steps e through g, and
      d2) if the deviation is not compensatable, executing step h,
   e) determining a correction form producible through material removal, which compensates for the deviation from the predetermined specification,
   f) correcting the articulation site geometry in accordance with the determined correction form, through material removal with a laser,
   g) again executing the step c,
   h) testing whether the deflection behavior corresponds to a lower accuracy class specification or deviates therefrom, wherein
      h1) if the deflection behavior corresponds to the lower specification, classifying the force-measuring element in the lower accuracy class and ending the method, and
      h2) if the deflection behavior deviates from the lower specification, classifying the force-measuring element as a defective product and ending the method.

2. The method according to claim 1, wherein the material is removed with a cutting tool.

* * * * *